US008074135B1

(12) United States Patent
Azimi et al.

(10) Patent No.: US 8,074,135 B1
(45) Date of Patent: *Dec. 6, 2011

(54) APPARATUS AND METHOD FOR TESTING AND DEBUGGING AN INTEGRATED CIRCUIT

(75) Inventors: Saeed Azimi, Union City, CA (US); Son Ho, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 208 days.

This patent is subject to a terminal disclaimer.

(21) Appl. No.: 12/500,245

(22) Filed: Jul. 9, 2009

Related U.S. Application Data

(63) Continuation of application No. 11/800,614, filed on May 7, 2007, now Pat. No. 7,562,276, which is a continuation of application No. 10/375,986, filed on Feb. 27, 2003, now Pat. No. 7,216,276.

(51) Int. Cl.
*G06F 11/00* (2006.01)

(52) U.S. Cl. ............ 714/742; 714/734; 714/28; 714/30; 714/724; 714/733; 714/741; 714/726; 714/727; 703/28; 703/23; 711/1; 370/366

(58) Field of Classification Search ........................ None
See application file for complete search history.

(56) References Cited

U.S. PATENT DOCUMENTS

| | | | |
|---|---|---|---|
| 4,674,089 A | 6/1987 | Poret et al. | |
| 4,897,837 A | 1/1990 | Ishihara et al. | |
| 5,649,129 A | 7/1997 | Kowert | |
| 5,689,515 A | 11/1997 | Panis | |
| 5,764,952 A | 6/1998 | Hill | |
| 5,771,240 A * | 6/1998 | Tobin et al. ................... | 714/724 |
| 5,781,560 A | 7/1998 | Kawano et al. | |
| 5,812,562 A | 9/1998 | Baeg | |
| 5,978,870 A | 11/1999 | Warren | |
| 5,978,937 A | 11/1999 | Miyamori et al. | |
| 6,028,983 A | 2/2000 | Jaber | |
| 6,115,763 A | 9/2000 | Douskey et al. | |
| 6,125,416 A | 9/2000 | Warren | |
| 6,148,381 A | 11/2000 | Jotwani | |
| 6,167,365 A * | 12/2000 | Karthikeyan et al. ........... | 703/28 |
| 6,189,115 B1 | 2/2001 | Whetsel | |
| 6,279,051 B1 | 8/2001 | Gates et al. | |
| 6,282,674 B1 | 8/2001 | Patel et al. | |
| 6,289,300 B1 | 9/2001 | Brannick et al. | |
| 6,314,530 B1 * | 11/2001 | Mann ......................... | 714/38.11 |
| 6,321,354 B1 | 11/2001 | Prunier | |
| 6,356,960 B1 | 3/2002 | Jones et al. | |
| 6,389,558 B1 | 5/2002 | Herrmann et al. | |

(Continued)

OTHER PUBLICATIONS

IEEE Standard 1149.1-2001 (Revision of IEEE Std 1149.1-1990), IEEE Standard Test Access Port and Boundary-Scan Architecture, (208 pp.).

(Continued)

*Primary Examiner* — John Trimmings

(57) ABSTRACT

An integrated circuit includes an embedded processor. An embedded in-circuit emulator is located within the embedded processor. The embedded in-circuit emulator performs a test on the integrated circuit. The embedded in-circuit emulator generates a testing result based on the test on the integrated circuit. Trace logic to generate trace data based on the testing result, the trace data being in a parallel format. A serializer is located on the integrated circuit. The serializer converts the parallel format of the trace data into a serial format. The serializer serially outputs the trace data in the serial format from the integrated circuit.

13 Claims, 4 Drawing Sheets

U.S. PATENT DOCUMENTS

| | | |
|---|---|---|
| 6,401,191 B1 | 6/2002 | Jones |
| 6,421,795 B2 | 7/2002 | Yamashita |
| 6,457,124 B1 | 9/2002 | Edwards et al. |
| 6,459,393 B1 * | 10/2002 | Nordman .................. 341/100 |
| 6,523,136 B1 | 2/2003 | Higashida |
| 6,526,501 B2 | 2/2003 | Edwards et al. |
| 6,642,736 B2 | 11/2003 | Mori et al. |
| 6,665,737 B2 | 12/2003 | Edwards |
| 6,687,857 B1 * | 2/2004 | Iwata et al. ............. 714/38.13 |
| 6,690,189 B2 | 2/2004 | Mori et al. |
| 6,779,133 B2 | 8/2004 | Whetsel |
| 6,813,732 B2 * | 11/2004 | Kurooka et al. ............. 714/45 |
| 6,820,051 B1 | 11/2004 | Swoboda |
| 6,834,367 B2 | 12/2004 | Bonneau et al. |
| 6,865,222 B1 | 3/2005 | Payne |
| 6,868,376 B2 | 3/2005 | Swoboda |
| 6,918,058 B2 | 7/2005 | Miura et al. |
| 6,957,180 B1 | 10/2005 | Nemecek |
| 6,973,592 B2 * | 12/2005 | Debling ..................... 714/30 |
| 7,003,599 B2 * | 2/2006 | Warren et al. ............... 710/71 |
| 7,007,201 B1 | 2/2006 | Byrne et al. |
| 7,010,612 B1 | 3/2006 | Si et al. |
| 7,031,903 B2 * | 4/2006 | Debling ..................... 703/27 |
| 7,076,708 B2 | 7/2006 | Faust et al. |
| 7,080,789 B2 | 7/2006 | Leaming |
| 7,096,310 B2 | 8/2006 | Norden |
| 7,127,649 B2 | 10/2006 | Learning |
| 7,197,680 B2 | 3/2007 | Kimelman et al. |
| 7,216,276 B1 | 5/2007 | Azimi et al. |
| 7,278,073 B2 | 10/2007 | Kimelman et al. |
| 7,327,725 B2 | 2/2008 | Schriel et al. |
| 7,350,121 B2 | 3/2008 | Creigh |
| 7,363,564 B2 | 4/2008 | Moss et al. |
| 7,412,633 B2 | 8/2008 | Kimelman et al. |
| 7,444,546 B2 | 10/2008 | Kimelman et al. |
| 7,444,571 B1 | 10/2008 | Azimi et al. |
| 7,496,812 B1 | 2/2009 | Azimi et al. |
| 7,496,818 B1 | 2/2009 | Azimi et al. |
| 2002/0026553 A1 | 2/2002 | Saito |
| 2002/0184001 A1 | 12/2002 | Yao |
| 2004/0078690 A1 * | 4/2004 | Kohashi ..................... 714/38 |
| 2004/0221201 A1 | 11/2004 | Seroff |

OTHER PUBLICATIONS

IEEE Standard Standard Test Access Port and Boundary-Scan Architecture, Institute of Electrical and Electronics Engineers (IEEE) as IEEE Standard 1149.1-2001, pp. 1-200.

* cited by examiner

APPARATUS AND METHOD FOR TESTING AND DEBUGGING AN INTEGRATED CIRCUIT

CROSS-REFERENCE TO RELATED APPLICATIONS

This application is a continuation of U.S. patent application Ser. No. 11/800,614, filed May 7, 2007, which is a continuation of U.S. patent application Ser. No. 10/375,986, filed Feb. 27, 2003. The disclosure of the above application is incorporated herein by reference.

BACKGROUND OF THE INVENTION

1. Field of the Invention

This invention relates generally to testing systems and devices and specifically to a system and method for downloading trace information from an integrated circuit.

2. Description of the Related Art

One disadvantage of shrinking microelectronics is that the testing of integrated circuits becomes exponentially more complex. A convenient and efficient means of testing increasingly complex integrated circuits is to design them with testing hardware already built-in. In 1985, a consortium of European electronics companies formed the Joint Test Action Group (JTAG) in order to create an industry standard which would define an architecture and software protocol for built-in testing hardware. The resulting standard, sometimes referred to as JTAG, was adopted by the Institute of Electrical and Electronics Engineers (IEEE) as IEEE Standard 1149.1.

The JTAG standard uses a boundary-scan architecture, so called because the JTAG circuitry is connected to a dedicated path around the integrated circuit's boundary (where the I/O pins are located). JTAG uses this boundary path to directly input to, and download data and instructions from, the I/O pins of the integrated circuit. The JTAG capability of an integrated circuit is accessed through a four pin JTAG test access port (TAP), through which instructions and data from external testing software are input and instructions and data from the integrated circuit are output.

The JTAG interface and circuitry can be used to implement debugging and emulation functions. In debugging embodiments, the JTAG interface is used to download code, execute it, and examine register and memory values. In system-on-a-chip (SOC) embodiments which perform emulation, an in-circuit emulator (ICE) is often embedded in the SOC. The embedded ICE is an actual processor, or a specially modified version of the standard processor, combined with special purpose instrumentation logic to perform the debugging and emulation functions. With emulation, one can test the embedded processor software with techniques such as code trace, benchmarking, trapping, evaluating breakpoints, profiling, etc. However, such extra functions usually require extra pins (besides the JTAG TAP) to output the resulting data.

FIG. 1 shows a conventional SOC 100 with an embedded ICE 105 located within the embedded processor 110 of the SOC 100. An external debugging and emulation program, located in personal computer (PC) 120, uses the JTAG interface logic 125 (by means of JTAG TAP, not shown here) to access and control ICE 105. When running, ICE 105 takes over the functions of the SOC 100. As such, ICE 105 can access, control, upload, and download from any of the memory 130 or peripheral modules 135 which control other SOC components 137.

The output of the debugging and emulation is forwarded to trace logic 140 and, more particularly, to trace FIFO (First-In, First-Out) buffer 145, where the trace output is collected for download, through trace port and status analyzer 150, to the external debugging and emulation program on PC 120, where the trace output is analyzed.

One problem with the prior art design is that the trace port and status analyzer 150 uses multiple pins of the SOC for the parallel output of the trace data. The amount of data is thus limited by the number of pins which can be designated as trace output pins in the SOC design. As SOCs become more complex, not only does the total number of I/O pins needed for critical functions increase—thus reducing the number of available pins which can be designated as trace output pins—but also the amount of trace data increases, thus requiring more trace output pins for transferring the increased trace data.

Usually, it is the number of trace output pins that are sacrificed for other uses in integrated circuit design, thereby causing difficulties as well as a bottleneck at the trace port output of the integrated circuit. One solution to this problem is to create a larger trace FIFO buffer 145 so that more data may be stored while the parallel output is downloading as much data as it can. However, area on an integrated circuit is in short supply, and using up more area for a trace FIFO buffer is expensive and wasteful.

Therefore, there is a need for an improved trace output interface for SOCs using in-circuit emulators (ICES).

SUMMARY OF THE INVENTION

The invention is directed to a system and method for testing an integrated circuit wherein a SERDES (Serializer/Deserializer) is used for outputting testing results from the integrated circuit. In one aspect, the SERDES is also used for inputting testing instructions and data into the integrated circuit.

In a preferred embodiment, the testing system comprises: a test host for running a debugging and testing analysis program, wherein said debugging and testing analysis program transmits testing instructions and data to the target integrated circuit, receives testing results from the target integrated circuit, and analyzes the received testing results; a testing interface on the target integrated circuit for receiving the testing instructions and data from the test host and forwarding the testing instructions and data; a testing unit on the target integrated circuit for receiving the testing instructions and data from the testing interface and for performing testing and debugging of the integrated circuit; a SERDES (Serializer/Deserializer) for serializing testing results, outputting the serialized testing results from the target integrated circuit, and for deserializing the serialized testing results; and an analyzer for receiving the testing results from said SERDES, for storing the testing results, and forwarding the testing results to the test host.

In another preferred embodiment, the SERDES additionally comprises a serializer for serializing incoming testing instructions and data, an input on the integrated circuit for receiving the serialized testing instructions and data, and a deserializer on the integrated circuit for deserializing the input testing instructions and data before forwarding the testing instructions and data to the testing interface.

In a preferred embodiment, the method for testing a target integrated circuit comprises the steps of: generating testing instructions and data; transmitting the testing instructions and data to the target integrated circuit; receiving the testing instructions and data at the target integrated circuit and forwarding the testing instructions and data to a testing unit on the integrated circuit; performing testing and debugging of the integrated circuit according to the received testing instructions and data; serializing testing results; outputting the serialized testing results from the target integrated circuit; deserializing the serialized testing results; forwarding the testing results; and performing debugging and testing analysis of the target integrated circuit with the received testing results.

In another preferred embodiment, the step of transmitting the testing instructions comprises the sub-step of serializing the testing instructions and data, and the step of receiving the testing instructions comprises the sub-steps of: receiving the serialized testing instructions and data; and deserializing the received testing instructions and data before forwarding them to the testing unit.

In a preferred embodiment, an integrated circuit comprises: an embedded processor; an embedded in-circuit emulator (ICE) for testing and debugging the integrated circuit; a trace buffer for storing testing and debugging data from said embedded ICE and said embedded processor; a frame capture unit for receiving the testing data from said trace buffer, and for packaging the testing data into frames; and a serializer for receiving the framed data from said frame capture unit, for serializing the framed data, and for outputting the serialized data.

In another preferred embodiment, the integrated circuit further comprises deserializing means for receiving serialized testing instructions and data from a testing and debugging analysis system, for deserializing the received testing instructions and data, and for forwarding the deserialized testing instructions and data to said testing means.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENT

Figure 1:
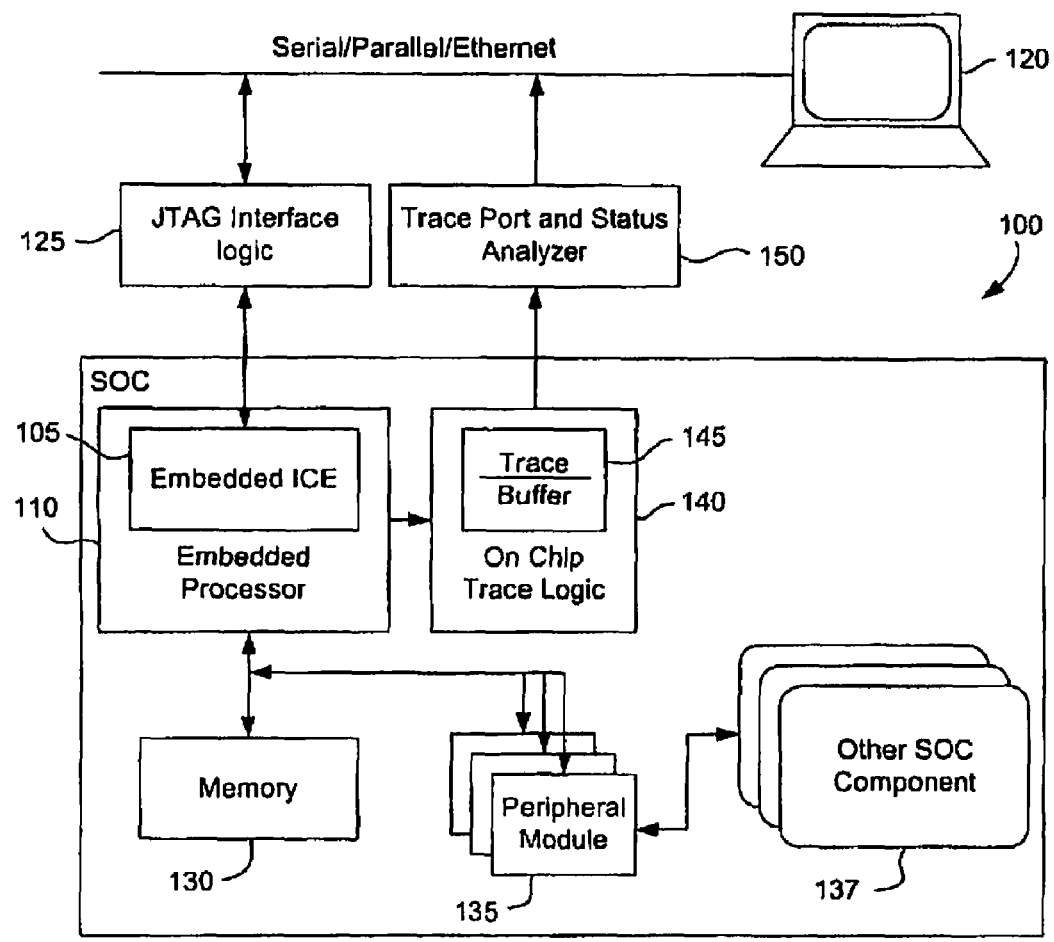
FIG. 1 is a block diagram of a prior art debugging and emulation system for a system-on-a-chip (SOC)
Figure 2:
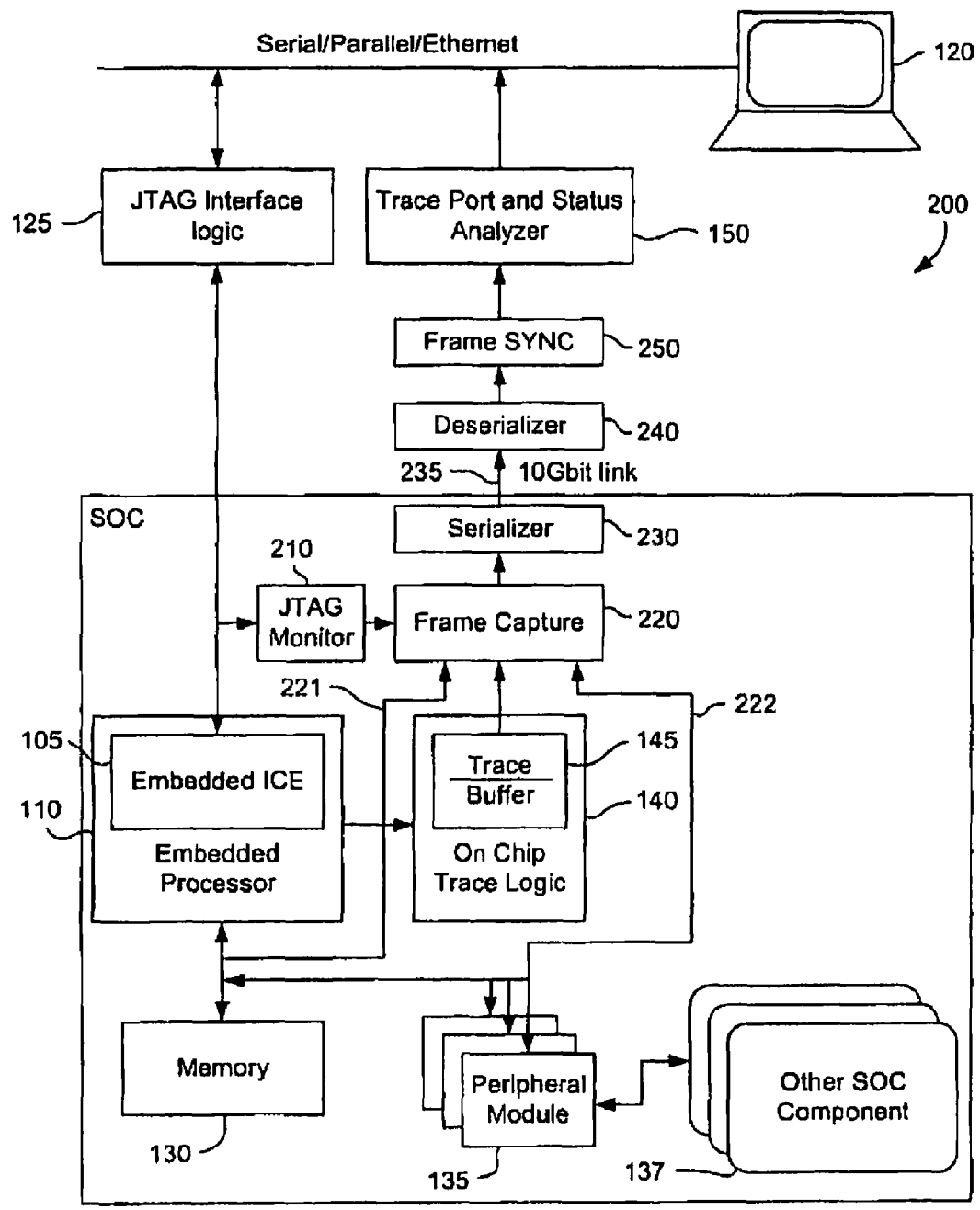
FIG. 2 is a block diagram of a debugging and emulation system for an SOC according to a preferred embodiment of the present invention.

FIG. 2 shows an SOC 200 with a debugging and emulation system according to a preferred embodiment of the present invention. Similarly to FIG. 1, embedded ICE 105 is located within embedded processor 110. An external debugging and emulation program, located in PC 120, uses the JTAG interface logic 125 (by means of JTAG TAP, not shown here) to access and control ICE 105. ICE 105 can access, control, upload, and download from any memory 130 or peripheral modules 135 which control other SOC components 137. The output of the debugging and emulation is forwarded to trace logic 140 and, more particularly, to trace FIFO (First-In, First-Out) 145.

Although the preferred embodiment in FIG. 2 uses a JTAG interface 125, it should be understood that the present invention is not limited to such an interface. In fact, any debugging and testing hardware, with or without an emulator, may be used with the present invention. Furthermore, the memory 130 may be any sort of memory, whether volatile or non-volatile, in an integrated circuit, and the trace buffer 145 may have any sort of configuration (i.e., it is not limited to a FIFO configuration).

Unlike FIG. 1, the output of trace FIFO 145 does not go directly to a trace output 150 port. Instead, the trace FIFO 145 output is forwarded to Frame Capture Unit 220 where it, along with other data, is packaged into frames. In other embodiments, it is possible for Frame Capture Unit 220 to capture data from the memory subsystems of the SOC (indicated by line 221) or from peripheral modules 135 (indicated by line 222). The frames into which this data is packaged are the communication units used by the serial output. Once a frame is completed it is forwarded to Serializer 230, which converts the parallel format of the frames to serial format for output. Once serialized, the data is transferred out of SOC 200 on communication link 235. To connect with SOC 200, communication link 235 only requires the minimum number of pins. In the preferred embodiment, there are only two pins used for serial differential output versus the nine or more pins used in the prior art.

In the present invention, a SERDES interface capable of transmission rates in the gigabit range is used to serially transmit data from the trace FIFO to the analyzing software on PC 120. In the preferred embodiment, a 10 Gb SERDES using XAUI circuitry requiring two (differential) pins is employed.

After the serialized data has crossed communication link 235, it arrives at Deserializer 240, where the data is reconfigured into its original parallel format. Thereafter, the data enters Frame Sync Unit 250 which synchronizes the parallel data so that the correct boundaries between an incoming frame and the next incoming frame can be located or otherwise established. In the preferred embodiment, the frames are Ethernet MAC frames, although any frame format can be used.

Once the frame boundaries are restored, the original data can be unpackaged from the frames and sent to the debugging and emulation software on PC 120. Such a transmission could be carried out, for example, by an interface connecting Frame Sync Unit 250 with a local area network (LAN), such as an Ethernet LAN. In other embodiments, it would be possible to connect the Frame Sync Unit 250 directly with a wide area network (WAN), such as the Internet, so that troubleshooting may be performed remotely. The Trace Port and Status Analyzer 150 captures the data now in parallel format in a large SRAM buffer for later analysis by the software on PC 120.

JTAG Monitor 210 receives configuration information from the external debugging and emulation program, located in PC 120, through JTAG interface logic 125 and ICE 105. This information is used to appropriately configure the Frame Capture Unit 220 to accept incoming data from trace FIFO buffer 145. This is needed because the timing and manner in which framing should be performed will be affected by the nature of the testing being performed, the nature of the testing output, the timing of the testing output, synchronization with the external system bus, etc. The JTAG monitor 210 may be very simple (e.g., comprised of a few registers) or very complex, depending on the embodiment of the present invention, and particularly depending on the types and sources of data being input into Frame Capture Unit 220.

Figure 2A:
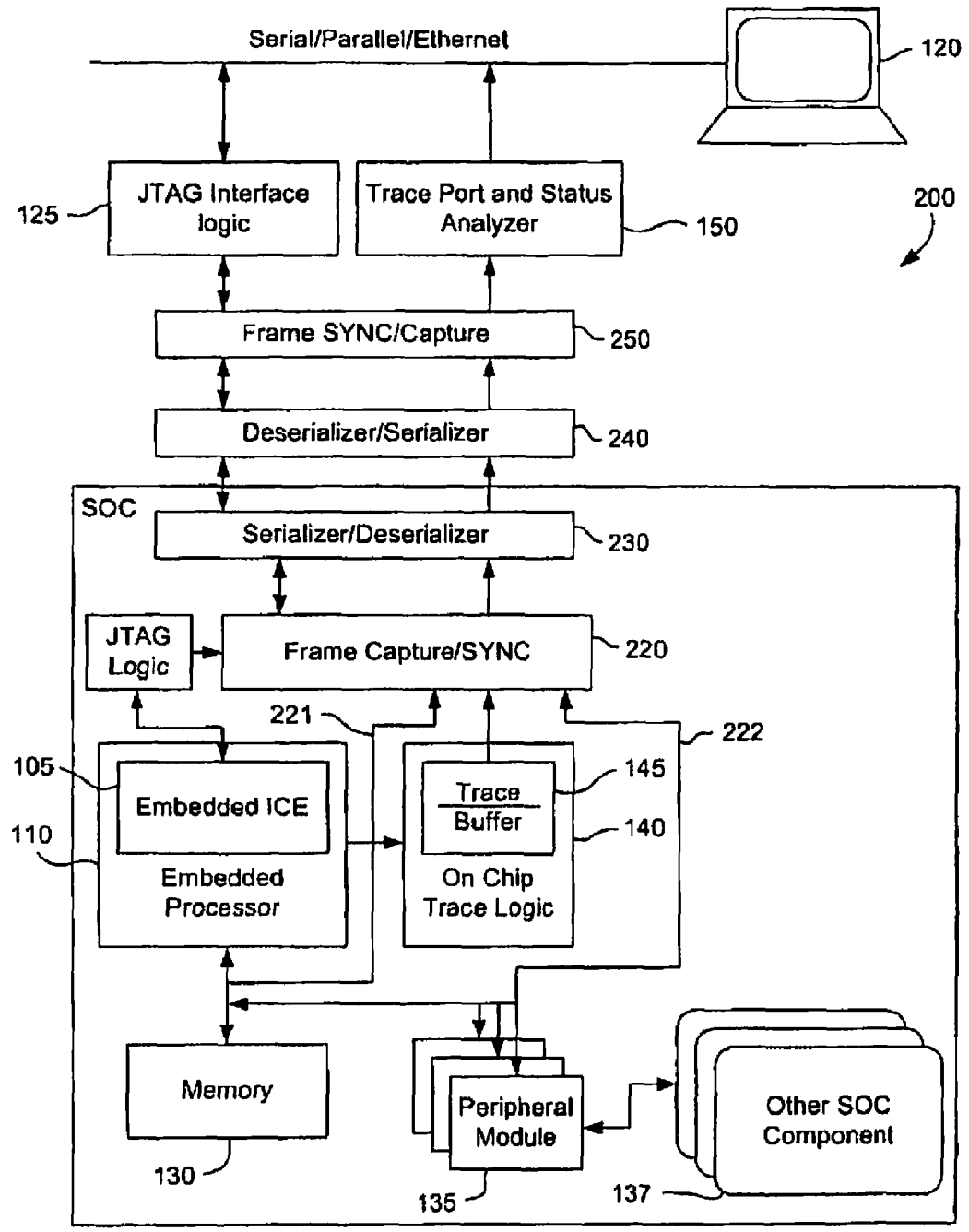
FIG. 2A is a block diagram of a debugging and emulation system for an SOC according to another preferred embodiment of the present invention.

FIG. 2A is a block diagram of a debugging and emulation system for an SOC according to another preferred embodiment of the present invention. The SERDES in FIG. 2A is bi-directional, in contrast to the uni-directional SERDES of FIG. 2. Thus, in addition to serving as the output for the testing and debugging data, the SERDES in FIG. 2A also serves as the input for the instructions and data which the testing and debugging program on PC 120 sends to embedded ICE 105 and embedded processor 110.

Some of the components of the SERDES in FIG. 2A have dual functions. For instance, Frame Sync Unit 250 in FIG. 2A acts as both a Frame Sync unit for the testing and debugging of data returning to the analysis software on PC 120, and as a Frame Capture Unit for the instructions and data which the analysis software on PC 120 is sending to the embedded ICE 105 and embedded processor 110. Both Serializer 230 and Deserializer 240 in FIG. 2A are combination Serializer/Deserializers for the bi-directional data traffic. Also, the Frame Sync Unit 250 and Frame Capture Unit 220 serve dual functions, namely frame synchronizing and frame capturing. The bi-directional SERDES of FIG. 2A may or may not need JTAG Monitor 210. It is contemplated that configuration data for Frame Capture Unit 220 may come directly from the analysis software on PC 120 through the bi-directional SERDES itself, thereby obviating any need for a separate JTAG Monitor 210. Furthermore, the present invention is not limited to using a JTAG interface, so that any hardware/firmware/software protocol for testing and debugging an integrated circuit may be used with the present invention.

Figure 3:
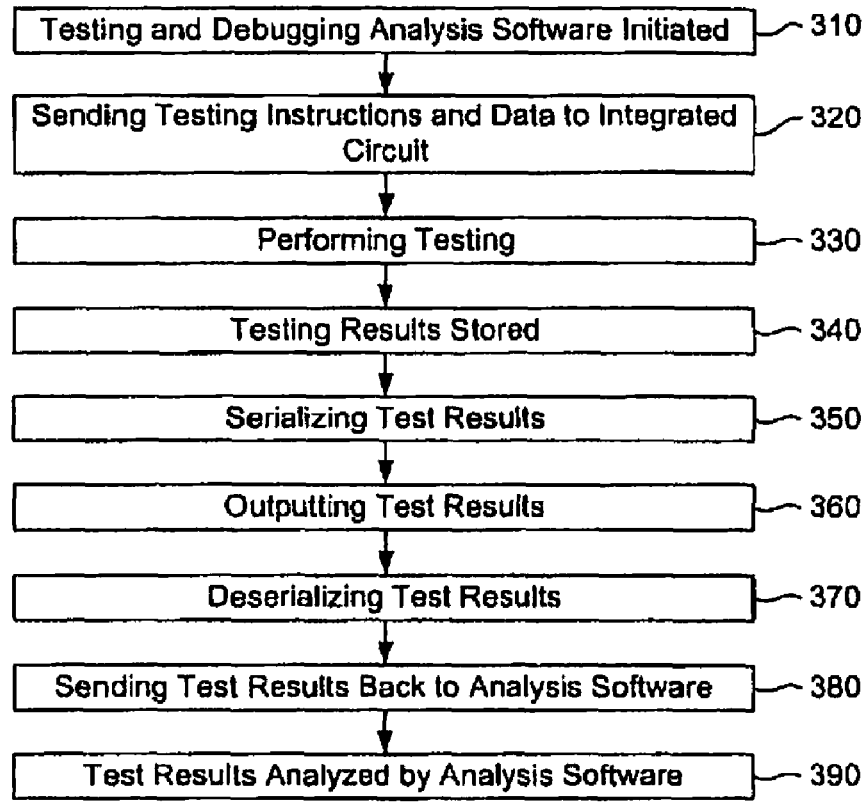
FIG. 3 is a flowchart showing a method for outputting debugging and emulation data from an SOC according to a preferred embodiment of the present invention.

A flow chart generally illustrating a method for testing and debugging an integrated circuit according to a preferred embodiment of the present invention is shown in FIG. 3. In step 310, the testing and debugging analysis software on PC 120 is initiated. In step 320, instructions for testing the integrated circuit and testing data are sent from the analysis software to the integrated circuit. In step 330, testing is performed on the integrated circuit in accordance with the testing instructions and data sent from the analysis software. The results of this testing and other data is stored in step 340. The stored data is serialized in step 350, and output off the integrated circuit in step 360. In step 370, the output data is deserialized and sent back to the analysis software in step 380. Finally, the testing results and data is analyzed in step 390 by the testing and debugging analysis software on PC 120.

Although the steps in FIG. 3 are shown in a particular order, it should be understood that these steps may occur in a different order, or even simultaneously. For example, steps 320 through 380 may be occurring substantially simultaneously, i.e., a train of instructions may be input (step 320) at the same time as results from the first instructions are arriving back at the analysis software in PC 120 (step 380). Furthermore, the steps should be understood in their broadest context. For example, storing step 340 may comprise storing testing results and data in longer term large-scale memory, such as ROM or RAM, for later framing operations, or in short term small scale memory, such as a bank of registers, for immediate processing and output.

Figure 3A:
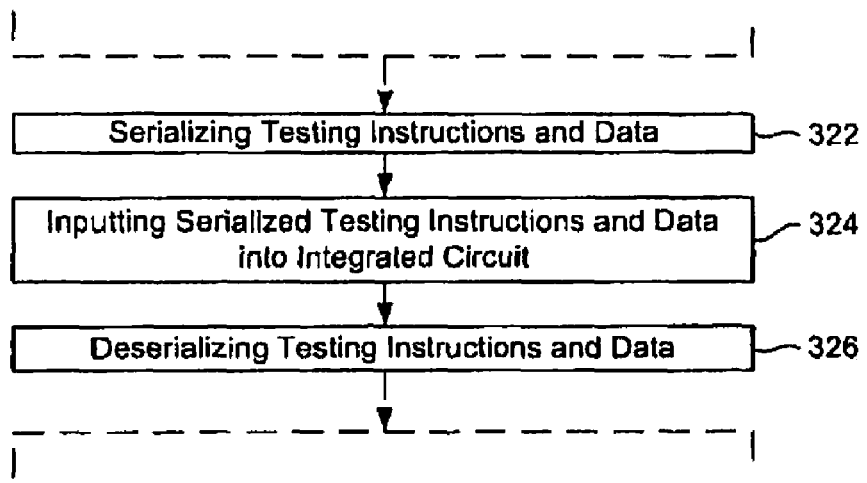
FIG. 3A is flowchart showing the sub-steps comprising step 320 in FIG. 3 according to another embodiment of the present invention.

FIG. 3A is a flowchart illustrating the sub-steps comprising the step of sending instructions for testing the integrated circuit and testing data from the analysis software to the integrated circuit (step 320 from FIG. 3) according to another embodiment of the present invention. These steps generally illustrate the operation of the embodiment shown in FIG. 2A. In such an embodiment, the inventive SERDES serves as both the input and the output for the testing and debugging operations. Returning to FIG. 3A, in step 322, the instructions and data from the analysis software on PC 120 are serialized before being input in step 324 into the integrated circuit. Once on-chip (i.e., in integrated circuit 200), the instructions and data are deserialized in step 326 so that they may be used by the on-chip testing and debugging hardware.

Some of the advantages of the present invention can be seen in the preferred embodiment described herein. Specifically, the number of pins required for the output of trace FIFO and other data is substantially reduced. Since there are a limited number of pins on an integrated circuit, the reduction of trace output pins increases the number of I/O pins available for other functions. This advantage will have increasing importance as integrated circuits become more complex and smaller. Another advantage is that, depending on the speed of the SERDES link, the data will be downloaded more quickly from the integrated circuit to the analyzing software. Yet another advantage is the elimination of the prior art high speed parallel interfaces which greatly increase chip power. Still another advantage is the reduced cost of packaging when implementing the present invention.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An integrated circuit comprising:
an embedded processor;
an embedded in-circuit emulator located within the embedded processor, the embedded in-circuit emulator configured to:
   perform a test on the integrated circuit; and
   generate a testing result based on the test on the integrated circuit;
trace logic configured to generate trace data based on the testing result, the trace data being in a parallel format;
a frame capture unit configured to package the trace data into a frame;
a monitor configured to i) receive configuration information from a device not located on the integrated circuit and ii) configure the frame capture unit to accept the trace data from the trace logic and package the trace data into the frame based on the configuration information; and
a serializer located on the integrated circuit, the serializer configured to:
   convert the parallel format of the trace data into a serial format; and serially output the trace data in the serial format from the integrated circuit.

2. The integrated circuit of claim 1, wherein the monitor comprises a Joint Task Action Group (JTAG) monitor.

3. The integrated circuit of claim 1, further comprising a trace buffer configured to store the testing result as the trace data, wherein the frame capture unit is configured to receive the trace data from the trace buffer.

4. The integrated circuit of claim 1, further comprising a frame sync unit in communication with the frame capture unit, the frame sync unit configured to identify a frame boundary of the trace data.

5. The integrated circuit of claim 1, wherein the test on the integrated circuit comprises a debugging and testing analysis program.

6. A system comprising:
the integrated circuit of claim 1; and
a test host configured to:
  transmit a testing instruction and testing data to the integrated circuit;
  receive the trace data from the integrated circuit; and
  analyze the trace data;
a deserializer configured to deserialize the trace data; and
an analyzer configured to:
  store the deserialized trace data; and
  transmit the deserialized trace data to the test host.

7. The system of claim 6, further comprising:
a second serializer configured to:
  receive the testing instruction and the testing data from the test host; and
  serialize the testing instruction and the testing data; and
a second deserializer that is located on the integrated circuit, the second deserializer configured to:
  deserialize the serialized testing instruction and the serialized testing data; and
  output the deserialized testing instruction and the deserialized testing data to the embedded in-circuit emulator.

8. A method of testing an integrated circuit, the integrated circuit including an embedded processor and an embedded in-circuit emulator, the embedded in-circuit emulator being located within the embedded processor, the method comprising:
using the in-circuit emulator to:
  perform a test on the integrated circuit; and
  generate a testing result based on the test on the integrated circuit;
generating trace data based on the testing result, the trace data being in a parallel format;
using a frame capture unit, packaging the trace data into a frame;
receiving, at a monitor, configuration information from a device not located on the integrated circuit;
configuring the frame capture unit to accept the trace data and package the trace data into the frame based on the configuration information,
converting the trace data in the parallel format into a serial format; and
serially outputting the trace data in the serial format from the integrated circuit.

9. The method of claim 8, wherein the monitor comprises a Joint Task Action Group (JTAG) monitor.

10. The method of claim 8, further comprising storing the trace data in a trace buffer prior to packaging the trace data into the frame.

11. The method of claim 8, further comprising identifying a frame boundary of the trace data.

12. The method of claim 8, further comprising:
deserializing the trace data;
receiving the deserialized trace data from the integrated circuit; and
analyzing the deserialized trace data.

13. The method of claim 12, further comprising:
receiving a testing instruction and testing data from a test host;
serializing the testing instruction and the testing data;
deserializing the serialized testing instruction and the serialized testing data; and
outputting the deserialized testing instruction and the deserialized testing data to the embedded in-circuit emulator.

* * * * *